(12) United States Patent
Bews

(10) Patent No.: US 12,045,722 B2
(45) Date of Patent: Jul. 23, 2024

(54) APPARATUS AND METHOD FOR DETERMINING DESIGN PLAN COMPLIANCE USING MACHINE LEARNING

(71) Applicant: Design Group Partners, LLC, Oldsmar, FL (US)

(72) Inventor: John Bews, Oldsmar, FL (US)

(73) Assignee: Design Group Partners, LLC, Oldsmar, FL (US)

( * ) Notice: Subject to any disclaimer, the term of this patent is extended or adjusted under 35 U.S.C. 154(b) by 0 days.

(21) Appl. No.: 17/986,532

(22) Filed: Nov. 14, 2022

(65) Prior Publication Data
US 2024/0169193 A1 May 23, 2024

(51) Int. Cl.
*G06N 3/08* (2023.01)
*G06F 30/13* (2020.01)

(52) U.S. Cl.
CPC ........... *G06N 3/08* (2013.01); *G06F 30/13* (2020.01)

(58) Field of Classification Search
CPC ................ G06N 3/08; G06F 30/13
See application file for complete search history.

(56) References Cited

U.S. PATENT DOCUMENTS

| | | | | |
|---|---|---|---|---|
| 4,964,060 | A * | 10/1990 | Hartsog | ............... G06F 30/13 703/1 |
| 9,836,749 | B1 | 12/2017 | Bowman | |
| 2015/0032479 | A1 | 1/2015 | Schembari | |
| 2016/0171633 | A1* | 6/2016 | DeWalt | ............ G06Q 10/06398 705/7.15 |
| 2017/0225336 | A1* | 8/2017 | Deyle | ..................... B25J 5/007 |
| 2018/0268087 | A1 | 9/2018 | Tierney | |
| 2020/0357000 | A1* | 11/2020 | Levine | .................. G06N 5/045 |
| 2021/0287138 | A1* | 9/2021 | Chang | ................... G06N 5/022 |
| 2021/0303747 | A1* | 9/2021 | Jalla | ........................ G06F 30/13 |
| 2022/0107977 | A1* | 4/2022 | Marthouse | ............. G06N 3/08 |
| 2022/0197306 | A1* | 6/2022 | Cella | ................... G06Q 10/087 |
| 2022/0245743 | A1 | 8/2022 | Srinivasan | |
| 2023/0087777 | A1* | 3/2023 | Sha | ........................ G06N 3/084 706/26 |

(Continued)

OTHER PUBLICATIONS

Xue et al. (Regulatory information transformation ruleset expansion to support automated building code compliance checking, Apr. 2022, pp. 1-13) (Year: 2022).*

(Continued)

*Primary Examiner* — George Giroux
(74) *Attorney, Agent, or Firm* — Caldwell Intellectual Property Law

(57) ABSTRACT

An apparatus and method for determining architectural plan compliance is illustrated herein. Determining design plan compliance using machine learning includes at least a processor and a memory communicatively connected to the processor, the memory containing instructions configuring the at least a processor to receive, by the processor, a design plan, wherein the design plan comprises structure parameters; obtain, by the processor, construction constraint and geographical constraint, identify, by the processor, a compliance threshold as a function of the construction constraints and geographical constraints, determine a divergence element related to compliance of the user design as a function of the compliance threshold and the design plan.

20 Claims, 8 Drawing Sheets

(56) References Cited

U.S. PATENT DOCUMENTS

2023/0244827 A1* 8/2023 Chandragiri ............ G06F 30/27
703/1

OTHER PUBLICATIONS

Kürün (Computer Representation of Building Codes using Natural Language Processing (NLP) Techniques, Jan. 2021, pp. 1-19) (Year: 2021).*

Bloch et al. (Comparing machine learning and rule-based inferencing for semantic enrichment of BIM models, Mar. 2018, pp. 256-272) (Year: 2018).*

* cited by examiner ated to an apparatus and method for determining design
APPARATUS AND METHOD FOR DETERMINING DESIGN PLAN COMPLIANCE USING MACHINE LEARNING

FIELD OF THE INVENTION

The present invention generally relates to the field of architecture design. In particular, the present invention is directed to an apparatus and method for determining design plan compliance using machine learning.

BACKGROUND

There are currently very long lead times and unnecessary reviews by multiple government agencies that architectural design plans must go through between completion and issuance of building permits.

SUMMARY OF THE DISCLOSURE

In an aspect, an apparatus for determining design plan compliance using machine learning includes at least a processor and a memory communicatively connected to the processor, the memory containing instructions configuring the at least a processor to receive, by the processor, a design plan, wherein the design plan comprises structure parameters, obtain, by the processor, construction constraint and geographical constraint, identify, by the processor, a compliance threshold as a function of the construction constraints and geographical constraints, determine a divergence element related to compliance of the user design as a function of the compliance threshold and the design plan.

In another aspect, a method for determining design plan compliance using machine learning includes at least a processor and a memory communicatively connected to the processor, the memory containing instructions configuring the at least a processor to, receiving, by the processor, a design plan, wherein the design plan comprises structure parameters, obtaining, by the processor, construction constraint and geographical constraint, identifying, by the processor, a compliance threshold as a function of the construction constraints and geographical constraints, determining a divergence element related to compliance of the user design as a function of the compliance threshold and the design plan.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to apparatus and methods that provide a user's design plan with a determination of adherence to constraints. Aspects of the present disclosure may consider complex conditions of various building materials, constructability, or the like to suggest potential design changes to a model.

Aspects of the present disclosure can be used to help users in the architectural field by eliminating labor and time-intensive constraint adherence analyses. Exemplary embodiments illustrating aspects of the present disclosure are described below in the context of several specific examples.

Figure 1:
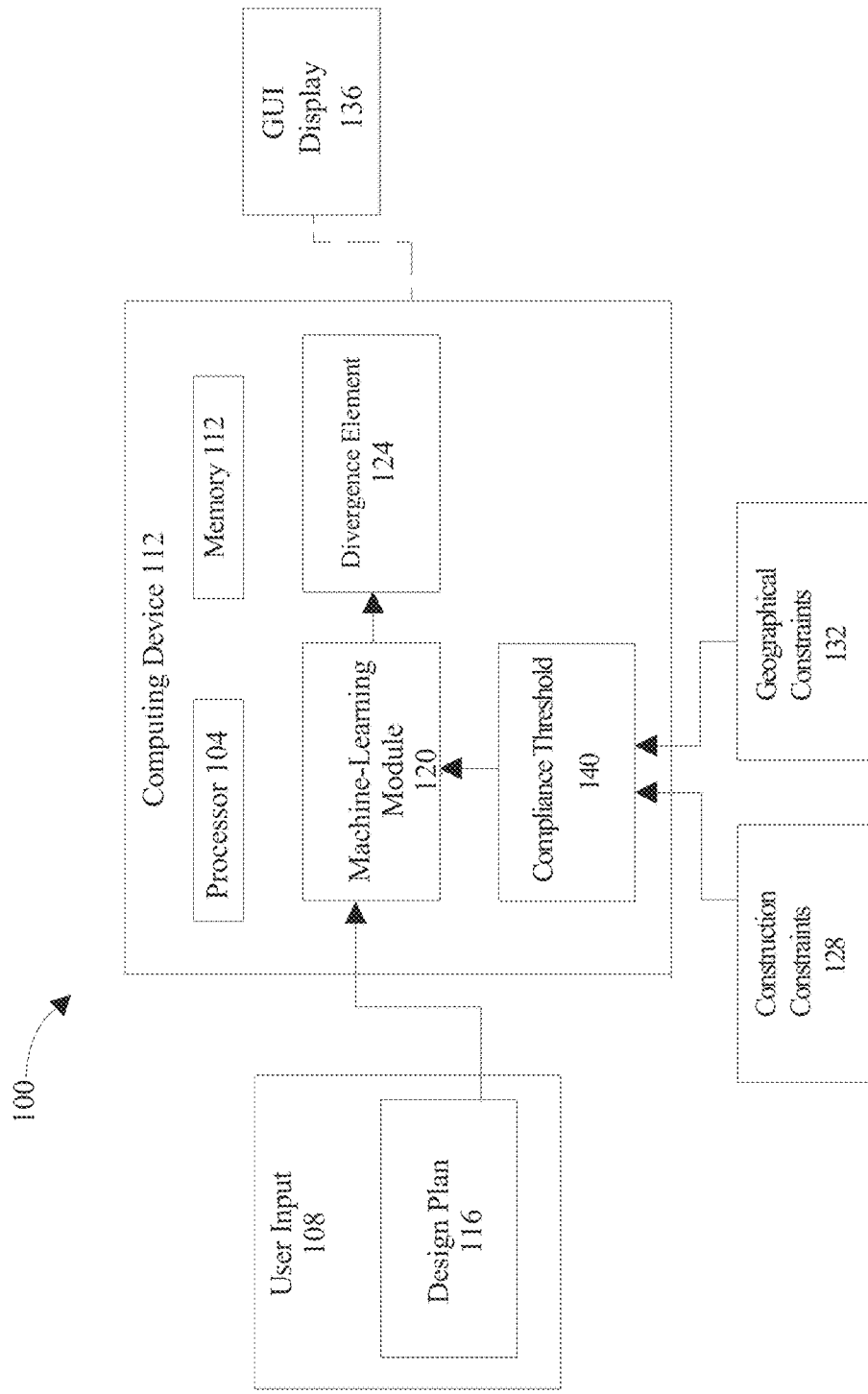
FIG. 1 is an exemplary embodiment of an apparatus for determining design plan compliance to constraints.

Referring now to FIG. 1, an exemplary embodiment of an apparatus 100 for determining design plan adherence to constraints using machine learning is illustrated. Apparatus 100 include, be included in, and/or be a computing device 112. Computing device 112 may be designed and/or configured to perform any method, method step, or sequence of method steps in any embodiment described in this disclosure, in any order and with any degree of repetition. For instance, a computing device 112 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Computing device 112 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Apparatus 100 also includes a processor 104. Processor 104 may include any processor incorporated in any computing device as described in this disclosure, including without limitation a microcontroller, microprocessor, digital signal processor (DSP) and/or system on a chip (SoC) as described in this disclosure. Processor and/or computing device may include, be included in, and/or communicate with a mobile device such as a mobile telephone or smartphone. A computing device incorporating processor 104 may include a single computing device operating independently, or may include two or more computing device operating in concert, in parallel, sequentially or the like; two or more computing devices may be included together in a single computing device or in two or more computing devices. Processor 104 and/or computing device may interface or communicate with one or more additional devices as described below in further detail via a network interface device. Network interface device may be utilized for connecting Processor 104 and/or computing device to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. A computing device including processor 104 may include but is not limited to, for example, a computing device or cluster of computing devices in a first location and a second computing device or cluster of computing devices in a second location. A computing device including processor 104 may include one or more computing devices dedicated to data storage, security, distribution of traffic for load balancing, and the like. A computing device including processor 104 may distribute one or more computing tasks as described below across a plurality of computing devices of computing device, which may operate in parallel, in series, redundantly, or in any other manner used for distribution of tasks or memory between computing devices. A computing device including processor 104 may be implemented using a "shared nothing" architecture in which data is cached at the worker, in an embodiment, this may enable scalability of apparatus 100 and/or computing device.

With continued reference to FIG. 1, processor 104 and/or computing device may be designed and/or configured to perform any method, method step, or sequence of method steps in any embodiment described in this disclosure, in any order and with any degree of repetition. For instance, processor 104 and/or computing device may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 104 and/or computing device may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Continuing to reference FIG. 1, apparatus 100 includes a memory 108, which may be implemented in any manner suitable for a primary and/or secondary memory described in this disclosure. Memory 108 may include instructions configuring processor 104 to perform various tasks. In some embodiments, apparatus 100 may include a computing device 112, where computing device includes processor 104 and/or memory 108. As used in this disclosure, "communicatively connected" means connected by way of a connection, attachment or linkage between two or more relata which allows for reception and/or transmittance of information therebetween. For example, and without limitation, this connection may be wired or wireless, direct or indirect, and between two or more components, circuits, devices, systems, and the like, which allows for reception and/or transmittance of data and/or signal(s) therebetween. Data and/or signals therebetween may include, without limitation, electrical, electromagnetic, magnetic, video, audio, radio and microwave data and/or signals, combinations thereof, and the like, among others. A communicative connection may be achieved, for example and without limitation, through wired or wireless electronic, digital or analog, communication, either directly or by way of one or more intervening devices or components. Further, communicative connection may include electrically coupling or connecting at least an output of one device, component, or circuit to at least an input of another device, component, or circuit. For example, and without limitation, via a bus or other facility for intercommunication between elements of a computing device. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

Still referring to FIG. 1, apparatus 100 is configured to receive a user input 108. In some embodiments, apparatus 100 may receive user input from one or more external computing devices, such as without limitation servers, desktops, smartphones, tablets, and the like. A "user input", as used in this disclosure, is a form of data entry received from an individual and/or group of individuals, such as an individual and/or group of individuals that is using and/or interacting with apparatus 104. User input 108 may include, but is not limited to, design plan 116. "Design plans" as used in this disclosure are architectural plans used to build a structure such as a building or house. Design plans 116 may, in a non-limiting example, be drafted by a design professional such as an architect. Design plans 116 may include blueprints, architectural plans, design projects, design schemes, design layouts, design drawings and the like. In an embodiment, a design professional may use a computer system to create a design plan or blueprint. For example, a design plan may be generated on a computer system using the computerized-aided design (CAD) software. "CAD" software as used in this disclosure defined as the use of computers to aid in the creation, modification, analysis, or optimization of a design. This software is used to increase the productivity of the designer, improve the quality of design, and improve communications through documentation.

User input 108 may include, but is not limited to text input, engagement with icons of a graphical user interface (GUI), and the like. Text input may include, without limitation, entry of characters, words, strings, symbols, and the like. In some embodiments, user input 108 may include one or more interactions with one or more elements of a graphical user interface (GUI). A "graphical user interface" as used in this disclosure is an interface including set of one or more pictorial and/or graphical icons corresponding to one or more computer actions. GUI may be configured to receive user input 108. GUI may include one or more event handlers. An "event handler" as used in this disclosure is a callback routine that operates asynchronously once an event takes place. Event handlers may include, without limitation, one or more programs to perform one or more actions based on user input, such as generating pop-up windows, submitting forms, changing background colors of a webpage, and the like. Event handlers may be programmed for specific user input, such as, but not limited to, mouse clicks, mouse hovering, touchscreen input, keystrokes, and the like. For instance, and without limitation, an event handler may be programmed to generate a pop-up window if a user double clicks on a specific icon. User input 108 may include, a manipulation of computer icons, such as, but not limited to, clicking, selecting, dragging and dropping, scrolling, and the like. In some embodiments, user input 108 may include an entry of characters and/or symbols in a user input field. A "user input field" as used in this disclosure is a portion of graphical user interface configured to receive data from an individual. A user input field may include, but is not limited to, text boxes, search fields, filtering fields, and the like. In some embodiments, user input 108 may include touch input. Touch input may include, but is not limited to, single taps, double taps, triple taps, long presses, swiping gestures, and the like. In some embodiments, GUI may be displayed on, without limitation, monitors, smartphones, tablets, vehicle displays, and the like. Vehicle displays may include, without limitation, monitors and/or systems in a vehicle such as multimedia centers, digital cockpits, entertainment systems, and the like. One of ordinary skill in the art upon reading this disclosure will appreciate the various ways a user may interact with graphical user interface.

Still referring to FIG. 1, apparatus 100 includes a machine learning module 120. Machine learning module 120 may be supervised and may be trained with training data. Training data may include a database of design plans and constraints. Machine-learning module may perform determinations, classification, and/or analysis steps, methods, processes, or the like as described in this disclosure using machine learning processes. A "machine learning process," as used in this disclosure, is a process that automatedly uses training data to generate an algorithm that will be performed by a computing device/module to produce outputs given data provided as inputs; this is in contrast to a non-machine learning software program where the commands to be executed are determined in advance by a user and written in a programming language. In one or more embodiments, a machine-learning module may be generated using training data. Training data may include inputs and corresponding predetermined outputs so that machine-learning module may use the correlations between the provided exemplary inputs and outputs to develop an algorithm and/or relationship that then allows machine-learning module to determine its own outputs for inputs. Training data may contain correlations that a machine-learning process may use to model relationships between two or more categories of data elements. The exemplary inputs and outputs may come from a database, such as any database described in this disclosure. In other embodiments, machine-learning module may obtain a training set by querying a communicatively connected database that includes past inputs and outputs. Training data may include inputs from various types of databases, resources, and/or user inputs and outputs correlated to each of those inputs so that a machine-learning module may determine an output. Correlations may indicate causative and/or predictive links between data, which may be modeled as relationships, such as mathematical relationships, by machine-learning processes, as described in further detail below. In one or more embodiments, training data may be formatted and/or organized by categories of data elements by, for example, associating data elements with one or more descriptors corresponding to categories of data elements. As a non-limiting example, training data may include data entered in standardized forms by persons or processes, such that entry of a given data element in a given field in a form may be mapped to one or more descriptors of categories. Data may include previous outputs such that machine learning module 120 iteratively produces outputs, thus creating a feedback loop. For example, an input may include the user design and an output may include a determination of compliance with the construction constraint threshold.

Continuing to reference FIG. 1, processor 104 is configured to generate a design plan approval or rejection 124 using a machine-learning module 120, as a function of the construction constraints 128 and geographic constraints 132. "Construction constraint" as used in this disclosure is a condition that impedes meeting a construction project goal. Construction constraints may include building codes and/or regulations such as, municipal building codes and any updated building codes. A municipality is a city or town that has corporate status and local government. Each municipality in the United States has its own building and local code, being uploaded on www.municode.com. A building code is a set of rules that specify the standards for constructed objects such as buildings and non-building structures. Construction constraints may also include one or more professional codes and standards, for example, the National Society of Professional Engineers have a specific Code of Ethics. For example, a code may not require anti-seismic construction, but the National Society of Professional Engineers Code of Ethics may recommend it. Alternatively, codes may include lesser environmental regulations, but standards might recommend for example, less emissions, better weatherproofing and the like. Construction constraints may also include environmental, structural, aesthetic, zoning-related, historical and the like, type of constraints. An "environmental constraint" as used in this disclosure is defined as a rule or consideration regarding the physical environment within a construction project. For example, an environmental constraint may include standards for air and/or water quality on a property, emission standards, energy efficiency standards, or the like. A "structural constraint" as used in this disclosure is defined as a rule or consideration regarding the process, structural features, materials, or the like involved in completing the physical construction of the building or home. For example, when constructing a foundation for a home the formwork and reinforcement must be placed before the concrete is poured, one or more features for fire-resistance, seismic resistance, wind resistance such as without limitation resistance to height-based wind differentials, resistance to storms such as hurricanes, or the like, and/or one or more additional requirements for robustness, stability, or similar matters. An "aesthetic constraint" as used in this disclosure is defined as a rule or consideration regarding the desired aesthetic or style of the anticipated structure and limits the range of potential design solutions that may be adopted. For example, a homeowner may desire a mid-century modern style of home which includes clean lines, ample windows and simplicity. "Zoning-related constraints" as used in this disclosure are defined as governmental land and structural use barriers and/or regulations concerning buildings. For example, zoning can regulate the amount of off-street parking that must be included with a new home or office, the type of lighting that accompanies buildings, the brightness of outdoor signs, the usage to which land and/or buildings may be put in a zone, such as a residential and/or commercial zone, setback requirements, height requirements, land surface area requirements, and the like. "Historical constraints" as used in this disclosure are defined as the conservation of a historic home or building, typically at least 50 years old, in order to enhance the quality of a historical city area. For example, there may be various stringent rules about maintaining, repairing, and replacing historic homes and materials, as well as designing new additions or making alterations.

Still referring to FIG. 1, the machine learning model 120 which performs a design plan review for building and local code adherence and approval may optimize and by-pass unnecessary review by multiple government agencies and remove long lead times that building plans must go through between completion and the issuance of building permits. The machine learning model 120 and/or software may provide a comprehensive review of the building codes against submitted plans to create an approval or deficiencies list for plans. In an embodiment, the machine learning model 120 will also check for common errors in buildability. The processor may provide a recommended corrective measure if applicable. For example, the anticipated structure according to the building plan may be too large for the proposed plot of land so the processor may recommend making the building plan smaller or removing a part of the building plan. Machine learning model 120 may analyze various user constraints such as, directions from a customer or developer regarding the intended use for the design plan and the intended aesthetic for the design plan. The machine learning model and training data may derive physical constraints from user constraints and various building codes, professional codes and the like. "Physical constraint" as used in this disclosure means that a property may have natural geographic features that prohibit the property owner from complying with various regulations such as design and building code regulations. A physical constraint may include an engineering challenge imposed by the location of the geographic location of the anticipated structure. For example, the anticipated structure may be being built on an uneven terrain such as a weathered or unstable rock formation which would make it difficult to construct safely or the anticipated structure may be being built on a wetland which also makes for unsafe construction due to shifting slabs and a weak foundation. A physical constraint may also include an engineering challenge imposed by the environment of the anticipated structure. For example, the anticipated structure may be in a hurricane-prone area where the structure should be elevated on an open foundation to reduce the risk of damage from flooding and storm-driven water or the anticipated structure may be in an earthquake-prone area where the structure should be constructed on top of flexible pads made of steel rubber and lead. Furthermore, the machine learning model 120 may recognize and catalog all of the variables for residential or commercial home design plans using a unique checklist for quality assurance steps. The machine learning model 120 may also gather the top checklists that building departments use to create a baseline testing for automating building plan reviews. In an embodiment, the machine learning model 120 may begin with the quality assurance checklist to identify known errors and then move on to building codes. This machine learning design plan review may be performed utilizing AutoCAD files and custom software to check against most current building codes and regulations as well as local codes per municipality. Quantum quality checks may review the plans for constructability, accuracy, and overall thoroughness in additional to building code compliance.

Furthermore, still referring to FIG. 1, "geographic constraints" 132 as used in this disclosure are the codes related to the location of the anticipated structure in the design plan 116. The identification of the laws, regulations and code related to the location may be performed using the machine learning model 120. For example, in Florida, there are state specific codes which govern hurricane regulations and municipal specific codes which govern the wind resistance regulations. Geofencing may be used to determine the location. A "geofence" as used in this disclosure is a virtual perimeter for a real-world geographic area. A geofence can be dynamically generated or match a predefined set of boundaries. The use of a geofence is called geofencing, and one example of use involves a location-aware device of a location-based service user entering or exiting a geofence. The identification of the topography aspect of a location may also be performed. This may be performed by GPS scanning. GPS scanning or tracking is the surveillance of a location through use of the Global Positioning System (GPS) to track the location of an entity or object remotely. For example, the location may be near a swamp prone to flooding, or the location may be at below sea level which is also prone to flooding due to weather conditions and the software may recommend certain provisions to accommodate the characteristics of the location.

Figure 2:
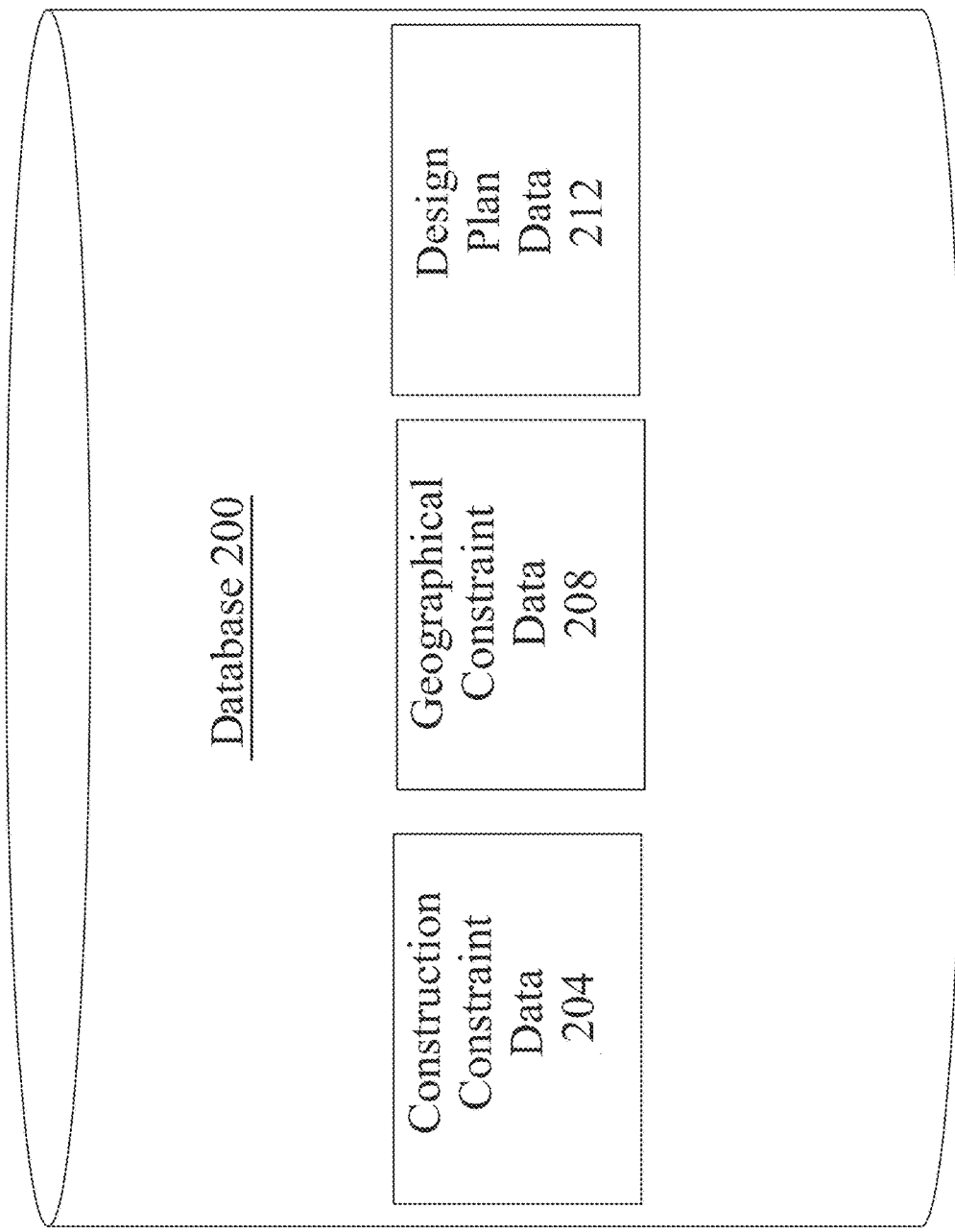
FIG. 2 is an illustration of an exemplary embodiment of a database of components.

Now referencing FIG. 2, an illustration of an exemplary embodiment of a database of components 200 is presented. Database may be implemented, without limitation, as a relational database, a key-value retrieval database such as a NOSQL database, or any other format or structure for use as a database that a person skilled in the art would recognize as suitable upon review of the entirety of this disclosure. Database may alternatively or additionally be implemented using a distributed data storage protocol and/or data structure, such as a distributed hash table or the like. Database may include a plurality of data entries and/or records as described above. Data entries in a database may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in a database may store, retrieve, organize, and/or reflect data and/or records as used herein, as well as categories and/or populations of data consistently with this disclosure.

Still referring to FIG. 2, in some embodiments, database 200 may include construction constraint data 204. Construction constraint data 204 may include, without limitation, applicable building codes and regulations, municipal building codes, municipal building code databases and any updated building codes. Database 200 may also include geographical constraint data 208. Geographical constraint data 208 may include, without limitation, the building codes and regulations related to the location of the anticipated structure in the design plan 116. Database 200 may also include design plan data 212. Design plan data 212 may include, without limitation, blueprints, architectural plans, design projects, design schemes, design layouts and design drawings. Any and all determinations described above may be performed and analyzed using an optimization program.

Still referring to FIG. 1, processor 104 may compute a score associated with the threshold and select compliance items to minimize and/or maximize the score, depending on whether an optimal result is represented, respectively, by a minimal and/or maximal score; a mathematical function, described herein as an "objective function," may be used by processor 104 to score each possible pairing. Objective function may be based on one or more objectives as described below. In various embodiments a score of a particular threshold may be based on a combination of one or more factors, including adherence to building codes or professional codes. Each factor may be assigned a score based on predetermined variables. In some embodiments, the assigned scores may be weighted or unweighted. Processor 104 may compute a score associated with each of environmental constraint, constructions constraint, zoning constraint, aesthetic constraint and the like.

Still referring to FIG. 1, apparatus 100 may generate an objective function. An "objective function" as used in this disclosure is a process of minimizing or maximizing one or more values based on a set of constraints. In some embodiments, an objective function of apparatus 100 may include an optimization criterion. For example, an optimization criterion may be a threshold. An optimization criterion may include any description of a desired value or range of values for one or more attributes; desired value or range of values may include a maximal or minimal value, a range between maximal or minimal values, or an instruction to maximize or minimize an attribute. As a non-limiting example, an optimization criterion may specify that an attribute should be within a 1% difference of an attribute criterion. An optimization criterion may alternatively request that an attribute be greater than a certain value. An optimization criterion may specify one or more tolerances for precision in a matching of attributes to improvement thresholds. An optimization criterion may specify one or more desired attribute criteria for a matching process. In an embodiment, an optimization criterion may assign weights to different attributes or values associated with attributes. One or more weights may be expressions of value to a user of a particular outcome, attribute value, or other facet of a matching process. Optimization criteria may be combined in weighted or unweighted combinations into a function reflecting an overall outcome desired by a user; function may be an attribute function to be minimized and/or maximized. A function may be defined by reference to attribute criteria constraints and/or weighted aggregation thereof as provided by apparatus 100; for instance, an attribute function combining optimization criteria may seek to minimize or maximize a function of improvement threshold matching.

With continued reference to FIG. 1, optimizing an objective function may include minimizing a loss function, where a "loss function" is an expression an output of which an optimization algorithm minimizes to generate an optimal result. As a non-limiting example, apparatus 100 may assign variables relating to a set of parameters, which may correspond to score attributes as described above, calculate an output of mathematical expression using the variables, and select a pairing that produces an output having the lowest size, according to a given definition of "size," of the set of outputs representing each of plurality of candidate improvement thresholds; size may, for instance, included absolute value, numerical size, or the like. Selection of different loss functions may result in identification of different potential pairings as generating minimal outputs. Objectives represented in an objective function and/or loss function may include minimization of differences between attributes and improvement thresholds.

Optimization of objective function may include performing a greedy algorithm process. A "greedy algorithm" is defined as an algorithm that selects locally optimal choices, which may or may not generate a globally optimal solution. For instance, processor 104 may select building code adherence so that scores associated therewith are the best score for each building code compliance item.

Still referring to FIG. 1, objective function may be formulated as a linear objective function, which processor 104 may solve using a linear program such as without limitation a mixed-integer program. A "linear program," as used in this disclosure, is a program that optimizes a linear objective function, given at least a constraint, for instance, construction constraint. In various embodiments, apparatus 100 may determine a threshold that maximizes a total score subject to a constraint that includes construction and geographical constraints. A mathematical solver may be implemented to solve for the set construction and geographical constraints that maximizes scores; mathematical solver may be implemented on processor 104 and/or another device in apparatus 100, and/or may be implemented on third-party solver.

With continued reference to FIG. 1, optimizing objective function may include minimizing a loss function, where a "loss function" is an expression an output of which an optimization algorithm minimizes to generate an optimal result. As a non-limiting example, processor 104 may assign variables relating to a set of parameters, which may correspond to score components as described above, calculate an output of mathematical expression using the variables, and select a construction constraint that produces an output having the lowest size, according to a given definition of "size," of the set of outputs representing each of plurality of candidate ingredient combinations; size may, for instance, included absolute value, numerical size, or the like. Selection of different loss functions may result in identification of different potential pairings as generating minimal outputs.

Still referring to FIG. 1, in some embodiments, apparatus 100 may generate a compliance threshold 140. A "compliance threshold" as used in this disclosure is a value or range of values that if reached determine a need for advancement in one or more attributes. Compliance threshold 140 may include, but is not limited to, ranges from 0-1, 1-10, 1-100, and the like. In some embodiments, compliance threshold may include, but is not limited to, percentages, ratios, and/or other metrics. Apparatus 100 may determine compliance threshold as a function of one or more proficiency and/or rankings of plurality of attributes 108. Compliance threshold 140 may determine a degree of improvement of one or more attributes of plurality of attributes 108. A "degree of improvement" as used in this disclosure is a measure of how much an attribute proficiency may be improved. For instance, and without limitation, a degree of improvement may include low, medium, high, extra high, and the like. In some embodiments, determination of compliance with the threshold may include a buffer or degree to which the user design is outside the threshold, a buffer or degree to which there is room to make modification while under the threshold, use of an optimization program to find the best or closest match under or over the threshold and the like. In another embodiment, there may be an output of a probability that the user design will be found to be under a threshold. Also, "threshold" could include multiple component thresholds for different categories, for example, there may be a structural requirement threshold, a plumbing threshold, an electrical threshold and the like. In some embodiments, if the user design does not fall within a buffer or degree of the threshold there may be an identification stating how far it is from being within the threshold, for example, there may be an output stating the user design requires three additional trees to be in compliance. In another embodiment, there may be an identification of reasons why and/or categories stating that it is not within the threshold, for example, the electrical outlets of the user design may not be within the specified distance, or the plumbing may be constructed of the incorrect piping material. In other embodiments, if the user design does not fall within a buffer or degree of the threshold there may be an identification of one or more actions or degrees of change necessary to come within the threshold, there may be an identification of alternatives to coming within the threshold, for example there may be a recommendation of adding an electrical outlet. In another embodiment, there may be an identification of a forecast of probability of success for a given attempt to come within threshold. In an embodiment, ways to offset a change in one category for a change in another to optimize cost and/or time may be identified, for example, spending less on emissions due to a determination of being under a threshold and using that to offset the additional costs of complying to a code such as a fire code or a plumbing code. A display of any of those potential outputs and/or combinations of them, may be displayed in a GUI. For example, the user may input one or more modifications to the GUI, redo any or all steps described above and display the results. The recommendation may be determined by processor 104 in a database or processor 104 may initiate a classifier which matches sets of inputs to improvement actions by for example, utilizing a first machine learning process to determine how close the input is to the threshold and then utilizing a second machine learning process which uses the same input and provides recommendations to achieve an improved result.

Still referencing FIG. 1, processor 104 may be configured to provide recommendations using a first machine-learning module, as a function of the construction constraints 128 and geographic constraints 132. First machine-learning module may be a classifier, as discussed below. In an embodiment, first machine-learning module may identify a potential problem in user design plan 116. For example, first machine-learning module may identify a lack of illumination in a stairway or a ceiling height which is too low and may indicate that the ceiling must be at least two feet taller. First-machine learning module may be supervised and may be trained with training data. Continuing to reference FIG. 1, processor 104 is configured to generate a recommendation using a second machine-learning module, as a function of the construction constraints 128 and geographic constraints 132. For example, second machine-learning module may identify action that may be taken to achieve an improved result. For example, second machine-learning module may also identify that two light switches are necessary. In an embodiment, a user may be guided through these recommendations. Second machine-learning module may be supervised. Second machine-learning module may be trained using training data. Second machine-learning module may include a generative adversarial network (GAN) which may process training data. As used herein, a "generative adversarial network" is an unsupervised learning task in machine learning that involves automatically discovering and learning the regularities or patterns in input data in such a way that the model can be used to generate or output new examples that plausibly could have been drawn from the original dataset.

In some embodiments, apparatus 100 may determine a divergence element 124 as a function of a compliance threshold 140. In one or more embodiments, the compliance threshold 140 may be determined as a function of the construction constraints 128 and/or the geographical constraints 132. For instance, and without limitation, apparatus 100 may receive user input 108 which may include a design plan 116. In some embodiments, apparatus 100 may determine a divergence element 124 of design plan 116 by comparing it to compliance threshold 124. In other embodiments, design plan 116 may be compared to one or more constraints such as, for example, construction constraints 128 and geographical constraints 132. In other embodiments, compliance threshold 124 may be received from an external computing device, user input, machine-learning module, and/or other forms of communication. For example, and without limitation, wherein the input of the geographical constraints and structural constrains output a threshold. In some embodiments, apparatus 100 may utilize a machine learning model. A machine learning model may be trained with training data correlating user data to compliance threshold 124. Training data may be received from user input, external computing devices, and/or previous iterations of processing. A machine learning model may be configured to input user data 108 and output one or more divergence elements of user data 108.

Still referring to FIG. 1, in some embodiments, apparatus 100 may be configured to rank an attribute of plurality of attributes 108 as a function of a ranking criterion. A "ranking criterion" as used in this disclosure is a value or values that determine a priority of one or more elements. A ranking criterion may include, but is not limited to, whole numbers, percentages, decimal values, and the like. Apparatus 100 may determine a ranking criterion based on a compliance of one or more attributes of plurality of attributes 108. For instance, and without limitation, apparatus 100 may rank plurality of attributes 108 in order of least compliant to most compliant. In other embodiments, apparatus 100 may rank plurality of attributes 108 in order of most compliant to least compliant, without limitation. Still referring to FIG. 1, apparatus 100 may determine compliance threshold 140 through generating a web index query. A "query" as used in this disclosure is a search function that returns data. Apparatus 100 may generate a query to search through databases for similar attributes. A query may include querying criteria. "Querying criteria" as used in this disclosure are parameters that constrain a search. Querying criteria may include, but is not limited to, attribute similarity, attribute category, freshness, and the like. Querying criteria may be tuned by a machine learning model, such as a machine learning model described below in FIG. 3.

Still referring to FIG. 1, processor 104 may engage in web searching and/or web crawling to obtain this obtain this information. "Web crawling" as used in this disclosure is defined as an internet bot that systematically browses the World Wide Web and is typically operated by search engines for the purposes of web indexing. Web crawling may include checking related websites and other sources of information that may indicate clues in reference to building codes, for example a query may include a web crawler function. A query may be configured to search for one or more keywords, key phrases, and the like. A keyword may be used by a query to filter potential results from a query. As a non-limiting example, a keyword may include "kinetics". A query may be configured to generate one or more key words and/or phrases as a function of plurality of attributes 108. A query may give a weight to one or more attributes of plurality of attributes 108. "Weights", as used herein, may be multipliers or other scalar numbers reflecting a relative importance of a particular attribute or value. A weight may include, but is not limited to, a numerical value corresponding to an importance of an element. In some embodiments, a weighted value may be referred to in terms of a whole number, such as 1, 100, and the like. As a non-limiting example, a weighted value of 0.2 may indicated that the weighted value makes up 20% of the total value. In some embodiments, a query may pair one or more weighted values to one or more attributes of plurality of attributes 108. Weighted values may be tuned through a machine-learning model, such as any machine learning model described throughout this disclosure, without limitation. In some embodiments, a query may generate weighted values based on prior queries. In some embodiments, a query may be configured to filter out one or more "stop words" that may not convey meaning, such as "of," "a," "an," "the," or the like.

Still referring to FIG. 1, a query may include a search index. A "search index" as used in this disclosure is a data structure that is configured to compare and/or match data. A search index may be used to link two or more data elements of a database. A search index may enable faster lookup times by linking similar data elements, such as attributes. In some embodiments, apparatus 100 and/or a query may generate an index classifier. In an embodiment, an index classifier may include a classifier. A "classifier," as used in this disclosure is a machine-learning model, such as a mathematical model, neural net, or program generated by a machine learning algorithm known as a "classification algorithm," as described in further detail below, that sorts inputs into categories or bins of data, outputting the categories or bins of data and/or labels associated therewith. An index classifier may include a classifier configured to input attributes and output web search indices. A "web search index," as defined in this disclosure is a data structure that stores uniform resource locators (URLs) of web pages together with one or more associated data that may be used to retrieve URLs by querying the web search index; associated data may include keywords identified in pages associated with URLs by programs such as web crawlers and/or "spiders." A web search index may include any data structure for ordered storage and retrieval of data, which may be implemented as a hardware or software module. A web search index may be implemented, without limitation, as a relational database, a key-value retrieval datastore such as a NOSQL database, or any other format or structure for use as a datastore that a person skilled in the art would recognize as suitable upon review of the entirety of this disclosure. Data entries in a web search index may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in a web search index may reflect categories, cohorts, and/or populations of data consistently with this disclosure. In an embodiment, a web search query at a search engine may be submitted as a query to a web search index, which may retrieve a list of URLs responsive to the query. In some embodiments, a computing device may be configured to generate a web search query based on a freshness and/or age of a query result. A freshness may include an accuracy of a query result. An age may include a metric of how outdated a query result may be. In some embodiments, a computing device may generate a web crawler configured to search the Internet for attributes.

Still referring to FIG. 1, apparatus 100 and/or another device may generate an index classifier using a classification algorithm, defined as a process whereby a computing device derives a classifier from training data. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. Training data may include data containing correlations that a machine-learning process may use to model relationships between two or more categories of data elements. For instance, and without limitation, training data may include a plurality of data entries, each entry representing a set of data elements that were recorded, received, and/or generated together; data elements may be correlated by shared existence in a given data entry, by proximity in a given data entry, or the like. Multiple data entries in training data may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data according to various correlations; correlations may indicate causative and/or predictive links between categories of data elements, which may be modeled as relationships such as mathematical relationships by machine-learning processes as described in further detail below. Training data may be formatted and/or organized by categories of data elements, for instance by associating data elements with one or more descriptors corresponding to categories of data elements. As a non-limiting example, training data may include data entered in standardized forms by persons or processes, such that entry of a given data element in a given field in a form may be mapped to one or more descriptors of categories. Elements in training data may be linked to descriptors of categories by tags, tokens, or other data elements; for instance, and without limitation, training data may be provided in fixed-length formats, formats linking positions of data to categories such as comma-separated value (CSV) formats and/or self-describing formats such as extensible markup language (XML), enabling processes or devices to detect categories of data.

Alternatively or additionally, and still referring to FIG. 1, training data may include one or more elements that are not categorized; that is, training data may not be formatted or contain descriptors for some elements of data. Machine-learning algorithms and/or other processes may sort training data according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data to be made applicable for two or more distinct machine-learning algorithms as described in further detail below. Training data used by a computing device may correlate any input data as described in this disclosure to any output data as described in this disclosure. In some embodiments, training data may include index training data. Index training data, defined as training data used to generate an index classifier, may include, without limitation, a plurality of data entries, each data entry including one or more elements of attribute data such as data of technical background, and one or more correlated improvement thresholds, where improvement thresholds and associated attribute data may be identified using feature learning algorithms as described below. Index training data and/or elements thereof may be added to, as a non-limiting example, by classification of multiple users' attribute data to improvement thresholds using one or more classification algorithms.

Still referring to FIG. 1, apparatus 100 may be configured to generate an index classifier using a Naïve Bayes classification algorithm. A Naïve Bayes classification algorithm generates classifiers by assigning class labels to problem instances, represented as vectors of element values. Class labels may be drawn from a finite set. A Naïve Bayes classification algorithm may include generating a family of algorithms that assume that the value of a particular element is independent of the value of any other element, given a class variable. A Naïve Bayes classification algorithm may be based on Bayes Theorem expressed as $P(A/B)=P(B/A) P(A) \div P(B)$, where $P(A/B)$ is the probability of hypothesis A given data B also known as posterior probability; $P(B/A)$ is the probability of data B given that the hypothesis A was true; $P(A)$ is the probability of hypothesis A being true regardless of data also known as prior probability of A; and $P(B)$ is the probability of the data regardless of the hypothesis. A Naïve Bayes algorithm may be generated by first transforming training data into a frequency table. A computing device may then calculate a likelihood table by calculating probabilities of different data entries and classification labels. A computing device may utilize a Naïve Bayes equation to calculate a posterior probability for each class. A class containing the highest posterior probability may be the outcome of prediction. A Naïve Bayes classification algorithm may include a gaussian model that follows a normal distribution. A Naïve Bayes classification algorithm may include a multinomial model that is used for discrete counts. A Naïve Bayes classification algorithm may include a Bernoulli model that may be utilized when vectors are binary.

With continued reference to FIG. 1, apparatus 100 may be configured to generate an index classifier using a K-nearest neighbors (KNN) algorithm. A "K-nearest neighbors algorithm" as used in this disclosure, includes a classification method that utilizes feature similarity to analyze how closely out-of-sample-features resemble training data to classify input data to one or more clusters and/or categories of features as represented in training data; this may be performed by representing both training data and input data in vector forms, and using one or more measures of vector similarity to identify classifications within training data, and to determine a classification of input data. K-nearest neighbors algorithm may include specifying a K-value, or a number directing the classifier to select the k most similar entries training data to a given sample, determining the most common classifier of the entries in the database, and classifying the known sample; this may be performed recursively and/or iteratively to generate a classifier that may be used to classify input data as further samples. For instance, an initial set of samples may be performed to cover an initial heuristic and/or "first guess" at an output and/or relationship, which may be seeded, without limitation, using expert input received according to any process as described herein. As a non-limiting example, an initial heuristic may include a ranking of associations between inputs and elements of training data. Heuristic may include selecting some number of highest-ranking associations and/or training data elements.

With continued reference to FIG. 1, generating a k-nearest neighbors algorithm may include generating a first vector output containing a data entry cluster, generating a second vector output containing an input data, and calculate the distance between the first vector output and the second vector output using any suitable norm such as cosine similarity, Euclidean distance measurement, or the like. Each vector output may be represented, without limitation, as an n-tuple of values, where n is at least two values. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute l as derived using a Pythagorean norm:

$$l = \sqrt{\sum_{i=0}^{n} a_i^2},$$

where $a_i$ is attribute number i of the vector. Scaling and/or normalization may function to make vector comparison independent of absolute quantities of attributes, while preserving any dependency on similarity of attributes; this may, for instance, be advantageous where cases represented in training data are represented by different quantities of samples, which may result in proportionally equivalent vectors with divergent values. As a non-limiting example, K-nearest neighbors algorithm may be configured to classify an input vector including a plurality of attribute data, key words and/or phrases, or the like, to clusters representing themes.

In an embodiment, and still referring to FIG. 1, apparatus 100 may generate a new threshold using a feature learning algorithm. A "feature learning algorithm," as used herein, is a machine-learning algorithm that identifies associations between elements of data in a training data set, where particular outputs and/or inputs are not specified. For instance, and without limitation, a feature learning algorithm may detect co-occurrences of sets of attribute data, as defined above, with each other. As a non-limiting example, a feature learning algorithm may detect co-occurrences of attribute data, as defined above, with each other. Apparatus 100 may perform a feature learning algorithm by dividing attribute data from a given source into various sub-combinations of such data to create attribute data sets as described above and evaluate which attribute data sets tend to co-occur with which other attribute data sets. In an embodiment, a first feature learning algorithm may perform clustering of data.

Continuing to refer to FIG. 1, a feature learning and/or clustering algorithm may be implemented, as a non-limiting example, using a k-means clustering algorithm. A "k-means clustering algorithm" as used in this disclosure, includes cluster analysis that partitions n observations or unclassified cluster data entries into k clusters in which each observation or unclassified cluster data entry belongs to the cluster with the nearest mean, using, for instance behavioral training set as described above. "Cluster analysis" as used in this disclosure, includes grouping a set of observations or data entries in way that observations or data entries in the same group or cluster are more similar to each other than to those in other groups or clusters. Cluster analysis may be performed by various cluster models that include connectivity models such as hierarchical clustering, centroid models such as k-means, distribution models such as multivariate normal distribution, density models such as density-based spatial clustering of applications with nose (DB SCAN) and ordering points to identify the clustering structure (OPTICS), subspace models such as biclustering, group models, graph-based models such as a clique, signed graph models, neural models, and the like. Cluster analysis may include hard clustering whereby each observation or unclassified cluster data entry belongs to a cluster or not. Cluster analysis may include soft clustering or fuzzy clustering whereby each observation or unclassified cluster data entry belongs to each cluster to a certain degree such as for example a likelihood of belonging to a cluster; for instance, and without limitation, a fuzzy clustering algorithm may be used to identify clustering of attribute data with multiple entity skill levels, and vice versa. Cluster analysis may include strict partitioning clustering whereby each observation or unclassified cluster data entry belongs to exactly one cluster. Cluster analysis may include strict partitioning clustering with outliers whereby observations or unclassified cluster data entries may belong to no cluster and may be considered outliers. Cluster analysis may include overlapping clustering whereby observations or unclassified cluster data entries may belong to more than one cluster. Cluster analysis may include hierarchical clustering whereby observations or unclassified cluster data entries that belong to a child cluster also belong to a parent cluster.

With continued reference to FIG. 1, apparatus 100 may generate a k-means clustering algorithm receiving unclassified attribute data and outputs a definite number of classified data entry clusters wherein the data entry clusters each contain cluster data entries. K-means algorithm may select a specific number of groups or clusters to output, identified by a variable "k." Generating a k-means clustering algorithm includes assigning inputs containing unclassified data to a "k-group" or "k-cluster" based on feature similarity. Centroids of k-groups or k-clusters may be utilized to generate classified data entry cluster. K-means clustering algorithm may select and/or be provided "k" variable by calculating k-means clustering algorithm for a range of k values and comparing results. K-means clustering algorithm may compare results across different values of k as the mean distance between cluster data entries and cluster centroid. K-means clustering algorithm may calculate mean distance to a centroid as a function of k value, and the location of where the rate of decrease starts to sharply shift, this may be utilized to select a k value. Centroids of k-groups or k-cluster include a collection of feature values which are utilized to classify data entry clusters containing cluster data entries. K-means clustering algorithm may act to identify clusters of closely related attribute data, which may be provided with improvement thresholds; this may, for instance, generate an initial set of improvement thresholds from an initial set of attribute data of a large number of users, and may also, upon subsequent iterations, identify new clusters to be provided new improvement threshold to which additional attribute data may be classified, or to which previously used attribute data may be reclassified.

With continued reference to FIG. 1, generating a k-means clustering algorithm may include generating initial estimates for k centroids which may be randomly generated or randomly selected from unclassified data input. K centroids may be utilized to define one or more clusters. K-means clustering algorithm may assign unclassified data to one or more k-centroids based on the squared Euclidean distance by first performing a data assigned step of unclassified data. K-means clustering algorithm may assign unclassified data to its nearest centroid based on the collection of centroids $c_i$ of centroids in set C. Unclassified data may be assigned to a cluster based on $argmin_{c_i \notin c} dist(c_i, x)^2$, where argmin includes argument of the minimum, ci includes a collection of centroids in a set C, and dist includes standard Euclidean distance. K-means clustering module may then recompute centroids by taking mean of all cluster data entries assigned to a centroid's cluster. This may be calculated based on $ci=1/|Si|\Sigma xi \notin Si^{xi}$. K-means clustering algorithm may continue to repeat these calculations until a stopping criterion has been satisfied such as when cluster data entries do not change clusters, the sum of the distances have been minimized, and/or some maximum number of iterations has been reached.

Still referring to FIG. 1, k-means clustering algorithm may be configured to calculate a degree of similarity index value. A "degree of similarity index value" as used in this disclosure, includes a distance measurement indicating a measurement between each data entry cluster generated by k-means clustering algorithm and a selected attribute data set. Degree of similarity index value may indicate how close a particular combination of attribute data is to being classified by k-means algorithm to a particular cluster. K-means clustering algorithm may evaluate the distances of the combination of attribute data levels to the k-number of clusters output by k-means clustering algorithm. Short distances between a set of attribute data and a cluster may indicate a higher degree of similarity between the set of attribute data and a particular cluster. Longer distances between a set of attribute data and a cluster may indicate a lower degree of similarity between an attribute data set and a particular cluster. With continued reference to FIG. 1, k-means clustering algorithm selects a classified data entry cluster as a function of the degree of similarity index value. In an embodiment, k-means clustering algorithm may select a classified data entry cluster with the smallest degree of similarity index value indicating a high degree of similarity between an attribute data set and the data entry cluster. Alternatively or additionally k-means clustering algorithm may select a plurality of clusters having low degree of similarity index values to attribute data sets, indicative of greater degrees of similarity. Degree of similarity index values may be compared to a threshold number indicating a minimal degree of relatedness suitable for inclusion of a set of attribute data in a cluster, where a degree of similarity indices falling under the threshold number may be included as indicative of high degrees of relatedness. Persons skilled in the art, upon reviewing the entirety of this disclosure, will be aware of various additional or alternative feature learning approaches that may be used consistently with this disclosure.

Figure 3:
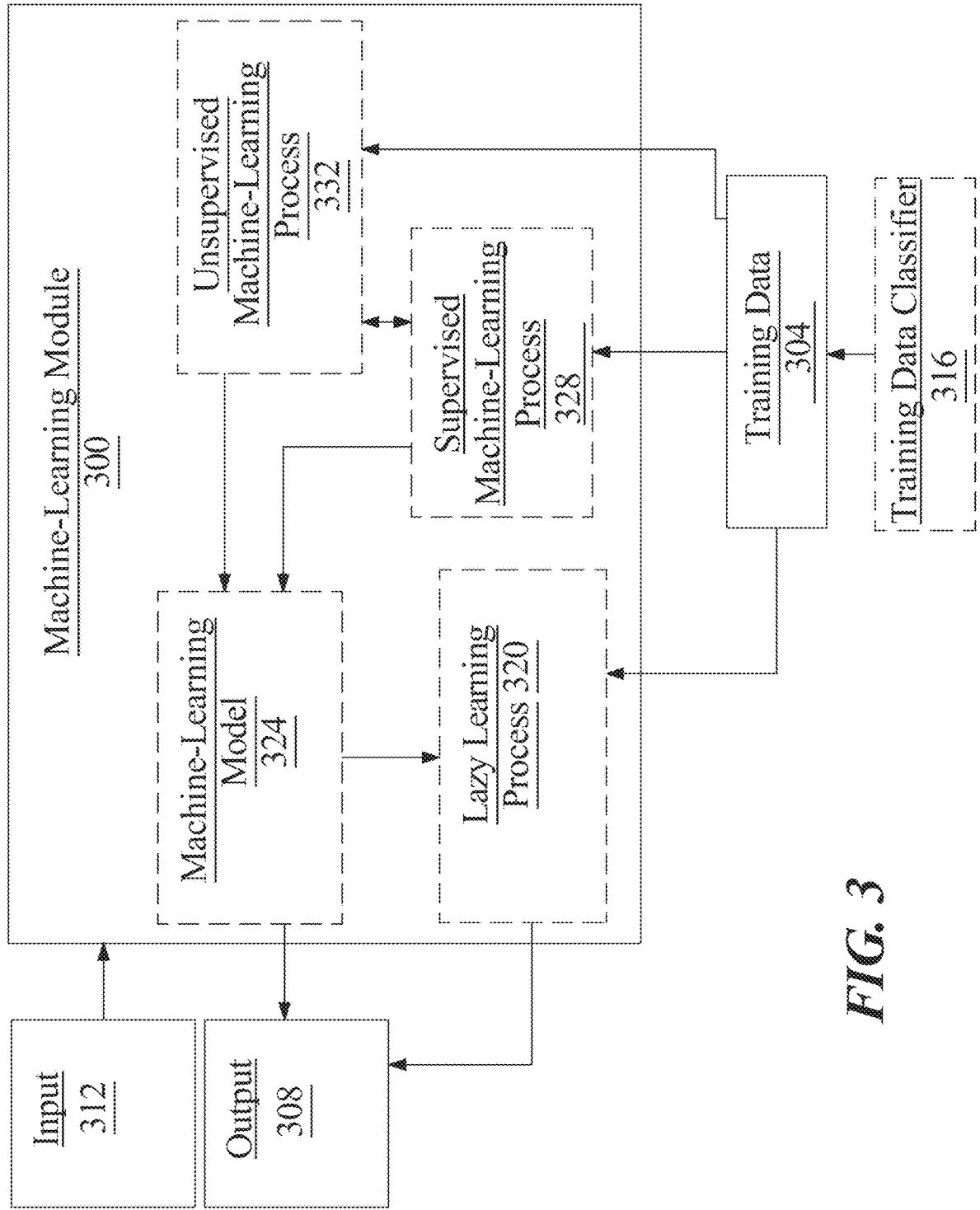
FIG. 3 is a diagram of an exemplary embodiment of a machine-learning module.

Referring now to FIG. 3, a diagram of an exemplary embodiment of a machine-learning module is presented. Machine-learning module may perform determinations, classification, and/or analysis steps, methods, processes, or the like as described in this disclosure using machine learning processes. A "machine learning process," as used in this disclosure, is a process that automatedly uses training data 304 to generate an algorithm that will be performed by a computing device/module to produce outputs 308 given data provided as inputs 312; this is in contrast to a non-machine learning software program where the commands to be executed are determined in advance by a user and written in a programming language.

Still referring to FIG. 3, "training data," as used herein, is data containing correlations that a machine-learning process may use to model relationships between two or more categories of data elements. For instance, and without limitation, training data 5304 may include a plurality of data entries, each entry representing a set of data elements that were recorded, received, and/or generated together; data elements may be correlated by shared existence in a given data entry, by proximity in a given data entry, or the like. Multiple data entries in training data 304 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 304 according to various correlations; correlations may indicate causative and/or predictive links between categories of data elements, which may be modeled as relationships such as mathematical relationships by machine-learning processes as described in further detail below. Training data 304 may be formatted and/or organized by categories of data elements, for instance by associating data elements with one or more descriptors corresponding to categories of data elements. As a non-limiting example, training data 304 may include data entered in standardized forms by persons or processes, such that entry of a given data element in a given field in a form may be mapped to one or more descriptors of categories. Elements in training data 304 may be linked to descriptors of categories by tags, tokens, or other data elements; for instance, and without limitation, training data 304 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 3, training data 304 may include one or more elements that are not categorized; that is, training data 304 may not be formatted or contain descriptors for some elements of data. Machine-learning algorithms and/or other processes may sort training data 304 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatically may enable the same training data 304 to be made applicable for two or more distinct machine-learning algorithms as described in further detail below. Training data 304 used by machine-learning module 300 may correlate any input data as described in this disclosure to any output data as described in this disclosure.

Further referring to FIG. 3, training data may be filtered, sorted, and/or selected using one or more supervised and/or unsupervised machine-learning processes and/or models as described in further detail below; such models may include without limitation a training data classifier 316. Training data classifier 316 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 300 may generate a classifier using a classification algorithm, defined as a process whereby a computing device and/or any module and/or component operating thereon derives a classifier from training data 304. Classification may be performed using, without limitation, linear classifiers such as without limitation logistic regression and/or naive Bayes classifiers, nearest neighbor classifiers such as k-nearest neighbors' classifiers, support vector machines, least squares support vector machines, fisher's linear discriminant, quadratic classifiers, decision trees, boosted trees, random forest classifiers, learning vector quantization, and/or neural network-based classifiers.

Still referring to FIG. 3, machine-learning module 300 may be configured to perform a lazy-learning process 320 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 304. Heuristic may include selecting some number of highest-ranking associations and/or training data 304 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 3, machine-learning processes as described in this disclosure may be used to generate machine-learning models 324. A "machine-learning model," as used in this disclosure, is a mathematical and/or algorithmic representation of a relationship between inputs and outputs, as generated using any machine-learning process including without limitation any process as described above and stored in memory; an input is submitted to a machine-learning model 324 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 324 may be generated by creating an artificial neural network, such as a convolutional neural network comprising an input layer of nodes, one or more intermediate layers, and an output layer of nodes. Connections between nodes may be created via the process of "training" the network, in which elements from a training data 304 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 3, machine-learning algorithms may include at least a supervised machine-learning process 328. At least a supervised machine-learning process 328, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include inputs and outputs as described above in this disclosure, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 304. Persons skilled in the art, upon reviewing the entirety of this disclosure, will be aware of various possible variations of at least a supervised machine-learning process 328 that may be used to determine relation between inputs and outputs. Supervised machine-learning processes may include classification algorithms as defined above.

Further referring to FIG. 3, machine learning processes may include at least an unsupervised machine-learning processes 332. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 3, machine-learning module 300 may be designed and configured to create a machine-learning model 324 using techniques for development of linear regression models. Linear regression models may include ordinary least squares regression, which aims to minimize the square of the difference between predicted outcomes and actual outcomes according to an appropriate norm for measuring such a difference (e.g., a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 3, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors' algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 4:
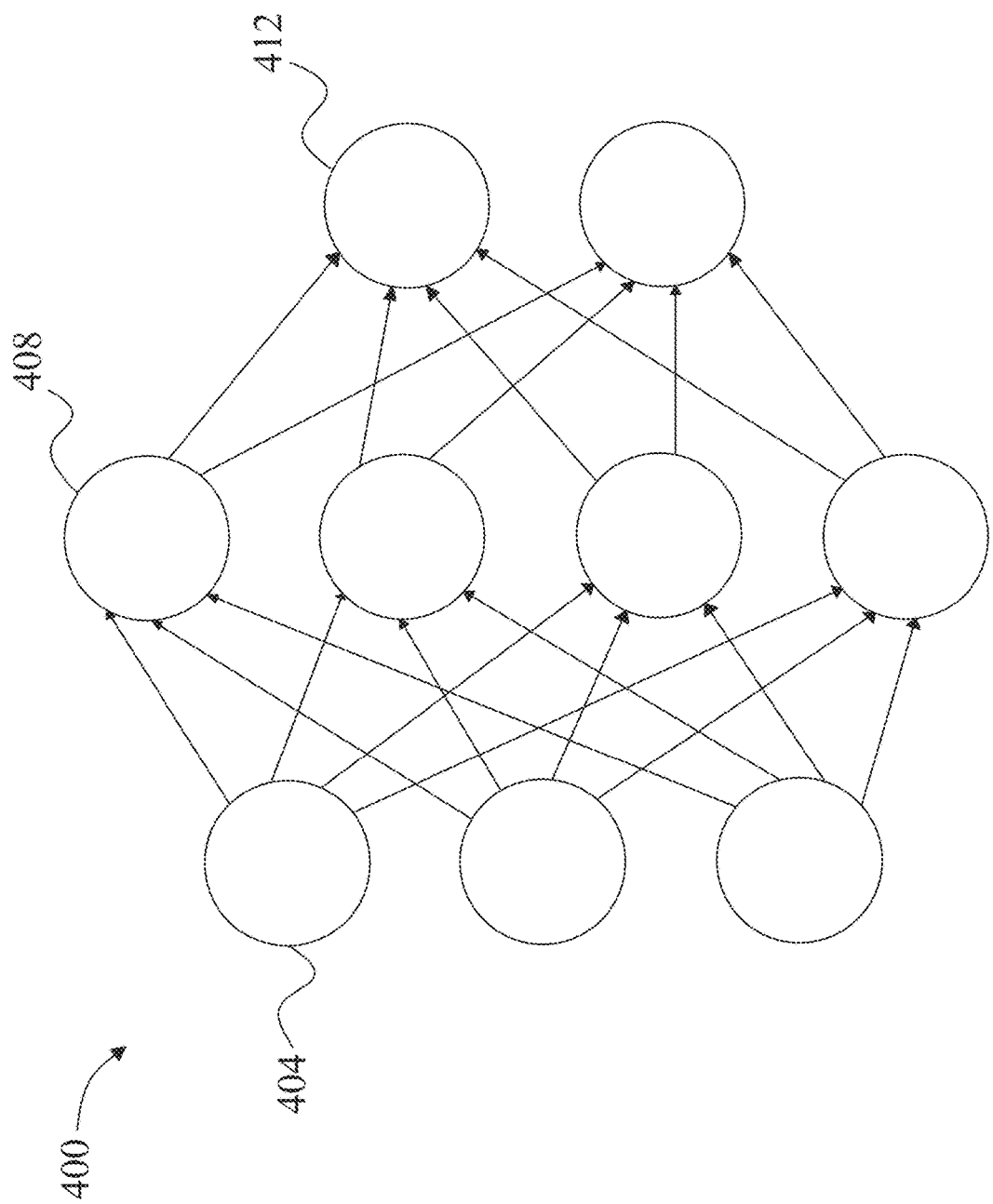
FIG. 4 is a diagram of an exemplary embodiment of a neural network.

Referring now to FIG. 4, an exemplary embodiment of neural network 400 is illustrated. A neural network 400 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 404, one or more intermediate layers 408, and an output layer of nodes 412. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 5:
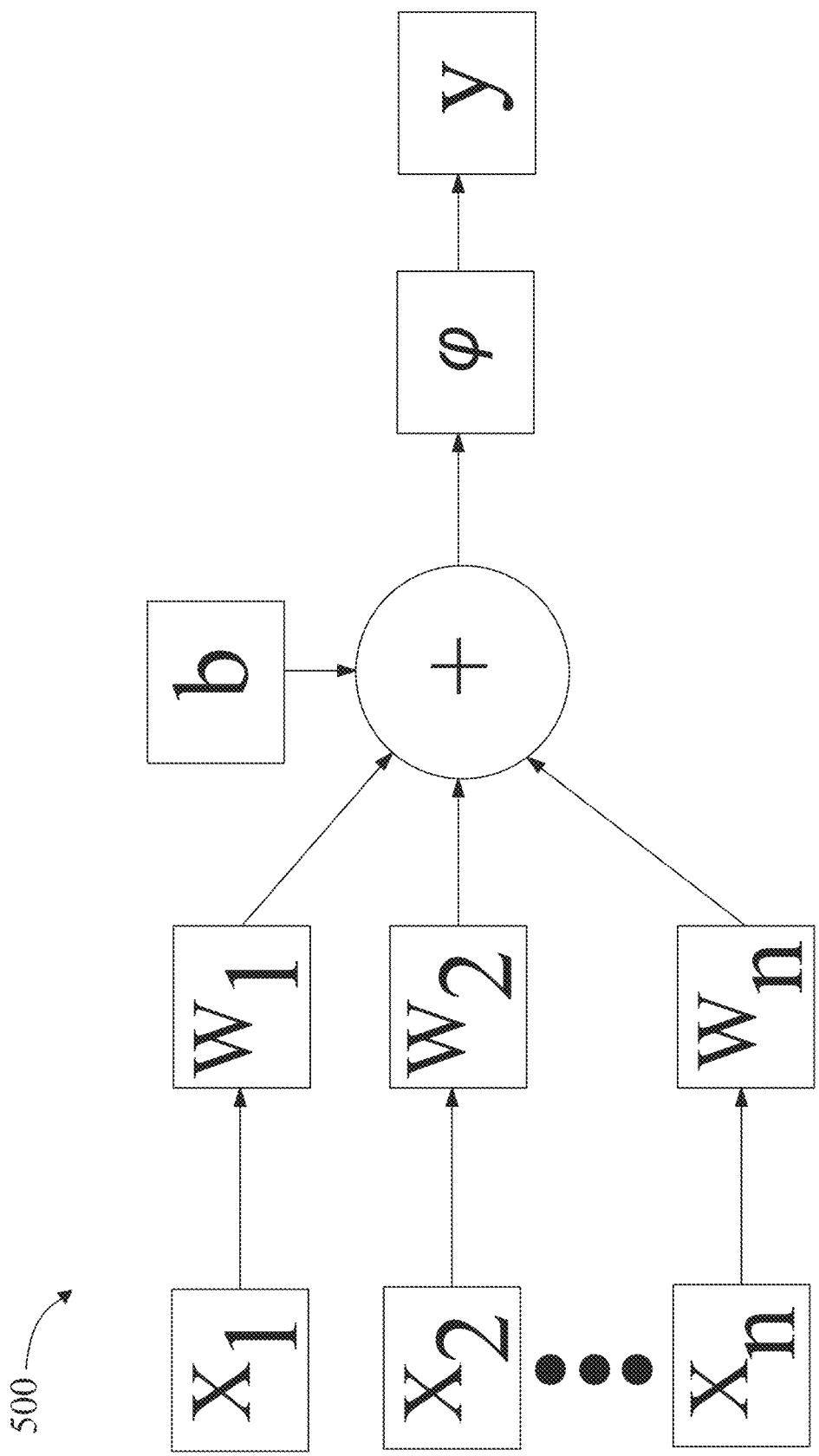
FIG. 5 is a diagram of an exemplary embodiment of a node of a neural network.

Referring now to FIG. 5, an exemplary embodiment 500 of a node of a neural network is illustrated. A node may include, without limitation a plurality of inputs xi that may receive numerical values from inputs to a neural network containing the node and/or from other nodes. Node may perform a weighted sum of inputs using weights $w_i$ that are multiplied by respective inputs xi. Additionally or alternatively, a bias b may be added to the weighted sum of the inputs such that an offset is added to each unit in the neural network layer that is independent of the input to the layer. The weighted sum may then be input into a function co, which may generate one or more outputs y. Weight $w_i$ applied to an input xi may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 6:
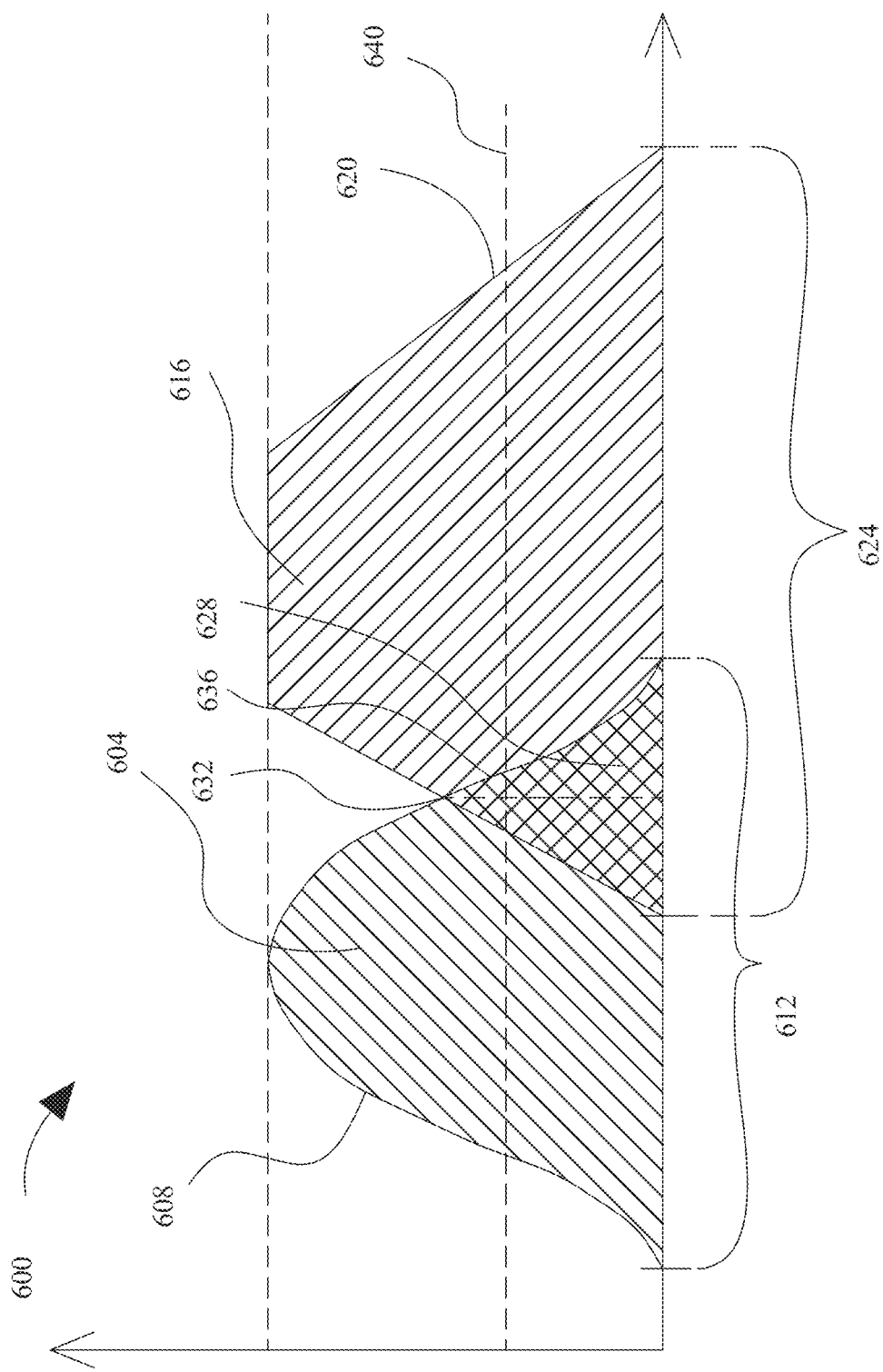
FIG. 6 is a diagram of an exemplary embodiment of a fuzzy set comparison.

Referring to FIG. 6, an exemplary embodiment of fuzzy set comparison 600 is illustrated. This system may be implemented by inputting multiple potentially subjective determinations related to constraints which are represented as fuzzy sets and get output a probability distribution indicating likelihood that the compliance will be under the threshold, a degree to which it is over or under or a yes/no determination. A first fuzzy set 604 may be represented, without limitation, according to a first membership function 608 representing a probability that an input falling on a first range of values 612 is a member of the first fuzzy set 604, where the first membership function 608 has values on a range of probabilities such as without limitation the interval [0,1], and an area beneath the first membership function 608 may represent a set of values within first fuzzy set 804. Although first range of values 612 is illustrated for clarity in this exemplary depiction as a range on a single number line or axis, first range of values 612 may be defined on two or more dimensions, representing, for instance, a Cartesian product between a plurality of ranges, curves, axes, spaces, dimensions, or the like. First membership function 608 may include any suitable function mapping first range 612 to a probability interval, including without limitation a triangular function defined by two linear elements such as line segments or planes that intersect at or below the top of the probability interval. As a non-limiting example, triangular membership function may be defined as:

$$y(x, a, b, c) = \begin{cases} 0, & \text{for } x > c \text{ and } x < a \\ \frac{x-a}{b-a}, & \text{for } a \leq x < b \\ \frac{c-x}{c-b}, & \text{if } b < x \leq c \end{cases}$$

a trapezoidal membership function may be defined as:

$$y(x, a, b, c, d) = \max\left(\min\left(\frac{x-a}{b-a}, 1, \frac{d-x}{d-c}\right), 0\right)$$

a sigmoidal function may be defined as:

$$y(x, a, c) = \frac{1}{1 - e^{-a(x-c)}}$$

a Gaussian membership function may be defined as:

$$y(x, c, \sigma) = e^{-\frac{1}{2}\left(\frac{x-c}{\sigma}\right)^2}$$

and a bell membership function may be defined as:

$$y(x, a, b, c,) = \left[1 + \left|\frac{x-c}{a}\right|^{2b}\right]^{-1}$$

Persons skilled in the art, upon reviewing the entirety of this disclosure, will be aware of various alternative or additional membership functions that may be used consistently with this disclosure.

Still referring to FIG. 6, first fuzzy set 604 may represent any value or combination of values as described above, including output from one or more machine-learning models. A second fuzzy set 616, which may represent any value which may be represented by first fuzzy set 604, may be defined by a second membership function 620 on a second range 624; second range 624 may be identical and/or overlap with first range 612 and/or may be combined with first range via Cartesian product or the like to generate a mapping permitting evaluation overlap of first fuzzy set 604 and second fuzzy set 616. Where first fuzzy set 604 and second fuzzy set 616 have a region 628 that overlaps, first membership function 608 and second membership function 620 may intersect at a point 632 representing a probability, as defined on probability interval, of a match between first fuzzy set 604 and second fuzzy set 616. Alternatively or additionally, a single value of first and/or second fuzzy set may be located at a locus 636 on first range 612 and/or second range 624, where a probability of membership may be taken by evaluation of first membership function 608 and/or second membership function 620 at that range point. A probability at 628 and/or 632 may be compared to a threshold 640 to determine whether a positive match is indicated. Threshold 640 may, in a non-limiting example, represent a degree of match between first fuzzy set 604 and second fuzzy set 616, and/or single values therein with each other or with either set, which is sufficient for purposes of the matching process; for instance, threshold may indicate a sufficient degree of overlap between an output from one or more machine-learning models and a predetermined class, for combination to occur as described above. Alternatively or additionally, each threshold may be tuned by a machine-learning and/or statistical process, for instance and without limitation as described in further detail below.

Further referring to FIG. 6, in an embodiment, a degree of match between fuzzy sets may be used to determine design plan compliance based on input data such as the design plan. Where multiple fuzzy matches are performed, degrees of match for each respective fuzzy set may be computed and aggregated through, for instance, addition, averaging, or the like, to determine an overall degree of match.

Still referring to FIG. 6, in an embodiment, design plan compliance may be compared to multiple building and regulation code fuzzy sets. Machine-learning methods as described throughout may, in a non-limiting example, generate coefficients used in fuzzy set equations as described above, such as without limitation x, c, and a of a Gaussian set as described above, as outputs of machine-learning methods. Likewise, design plan compliance may be used indirectly to determine a fuzzy set, as design plan compliance fuzzy set may be derived from outputs of one or more machine-learning models that take the design problem directly or indirectly as inputs.

Still referring to FIG. 6, a computing device may use a logic comparison program, such as, but not limited to, a fuzzy logic model to determine a score. A score may include, but is not limited to, amateur, average, knowledgeable, superior, and the like; each such score may be represented as a value for a linguistic variable representing score, or in other words a fuzzy set as described above that corresponds to a degree of similarity as calculated using any statistical, machine-learning, or other method that may occur to a person skilled in the art upon reviewing the entirety of this disclosure. In other words, a given element of design plan compliance may have a first non-zero value for membership in a first linguistic variable value and a second non-zero value for membership in a second linguistic variable value. In some embodiments, determining a score may include using a linear regression model. A linear regression model may include a machine learning model. A linear regression model may be configured to map data of design compliance plans to one or more scores. A score classification model may be configured to input collected data and cluster data to a centroid based on, but not limited to, frequency of appearance, and the like. Centroids may include scores assigned to them such that elements of the design plan may each be assigned a score. In some embodiments, and score classification model may include a K-means clustering model. In some embodiments, and score classification model may include a particle swarm optimization model. In some embodiments, determining a score of design plan compliance may include using a fuzzy inference engine. A fuzzy inference engine may be configured to map one or more design plan compliance elements using fuzzy logic. In some embodiments, a plurality of entity assessment devices may be arranged by a logic comparison program into score arrangements. An "score arrangement" as used in this disclosure is any grouping of objects and/or data based on skill level and/or output score. This step may be implemented as described above in FIGS. 1-7. Membership function coefficients and/or constants as described above may be tuned according to classification and/or clustering algorithms. For instance, and without limitation, a clustering algorithm may determine a Gaussian or other distribution of questions about a centroid corresponding to a given score level, and an iterative or other method may be used to find a membership function, for any membership function type as described above, that minimizes an average error from the statistically determined distribution, such that, for instance, a triangular or Gaussian membership function about a centroid representing a center of the distribution that most closely matches the distribution. Error functions to be minimized, and/or methods of minimization, may be performed without limitation according to any error function and/or error function minimization process and/or method as described in this disclosure.

Further referring to FIG. 6, an inference engine may be implemented according to input and/or output membership functions and/or linguistic variables. For instance, a first linguistic variable may represent a first measurable value pertaining to a degree of similarity, while a second membership function may indicate a degree of similarity of a subject thereof, or another measurable value. Continuing the example, an output linguistic variable may represent, without limitation, a score value. An inference engine may combine rules, such as: "if the difficulty level is 'hard' and the popularity level is 'high', the question score is 'high'"— the degree to which a given input function membership matches a given rule may be determined by a triangular norm or "T-norm" of the rule or output membership function with the input membership function, such as min (a, b), product of a and b, drastic product of a and b, Hamacher product of a and b, or the like, satisfying the rules of commutativity (T(a, b)=T(b, a)), monotonicity: (T(a, b)≤T (c, d) if a≤c and b≤d), (associativity: T(a, T(b, c))=T(T(a, b), c)), and the requirement that the number 1 acts as an identity element. Combinations of rules ("and" or "or" combination of rule membership determinations) may be performed using any T-conorm, as represented by an inverted T symbol or "⊥," such as max(a, b), probabilistic sum of a and b (a+b−a*b), bounded sum, and/or drastic T-conorm; any T-conorm may be used that satisfies the properties of commutativity: ⊥(a, b)=⊥(b, a), monotonicity: ⊥(a, b)≤⊥(c, d) if a≤c and b≤d, associativity: ⊥(a, ⊥(b, c))=⊥(⊥(a, b), c), and identity element of 0. Alternatively or additionally T-conorm may be approximated by sum, as in a "product-sum" inference engine in which T-norm is product and T-conorm is sum. A final output score or other fuzzy inference output may be determined from an output membership function as described above using any suitable defuzzification process, including without limitation Mean of Max defuzzification, Centroid of Area/Center of Gravity defuzzification, Center Average defuzzification, Bisector of Area defuzzification, or the like. Alternatively or additionally, output rules may be replaced with functions according to the Takagi-Sugeno-King (TSK) fuzzy model.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 7:
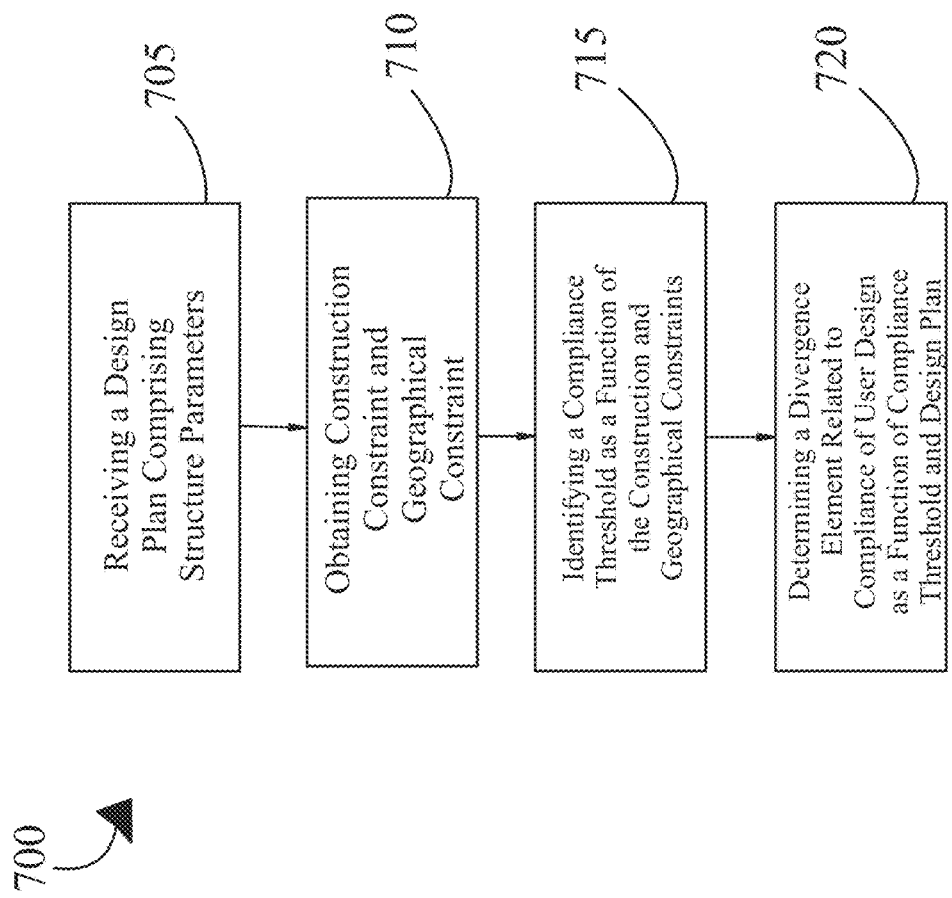
FIG. 7 is a flowchart of a method of determining design plan compliance to constraints.

Referring now to FIG. 7, a method 700 of using an apparatus for determining design plan compliance to constraints is presented. At step 705, method 700 includes receiving a design plan comprising structure parameters. User design plan may be received through user input, from external computing devices, such as a remote device, and the like. This step may be implemented as described above in FIGS. 1-6, without limitation.

Still referring to FIG. 7, at step 710, method 700 includes obtaining construction constraint and geographical constraints. These constraints may be related to the location of the anticipated structure. This step may be implemented as described above in FIGS. 1-6, without limitation.

Still referring to FIG. 7, at step 715, method 700 includes identifying a compliance threshold as a function of the construction and geographical constraints. This step may be implemented as described above in FIGS. 1-6, without limitation.

Still referring to FIG. 7, at step 720, method 700 includes determining a divergence element related to compliance of user design as a function of the compliance threshold and design plan. This step may be implemented as described above in FIGS. 1-6, without limitation.

Figure 8:
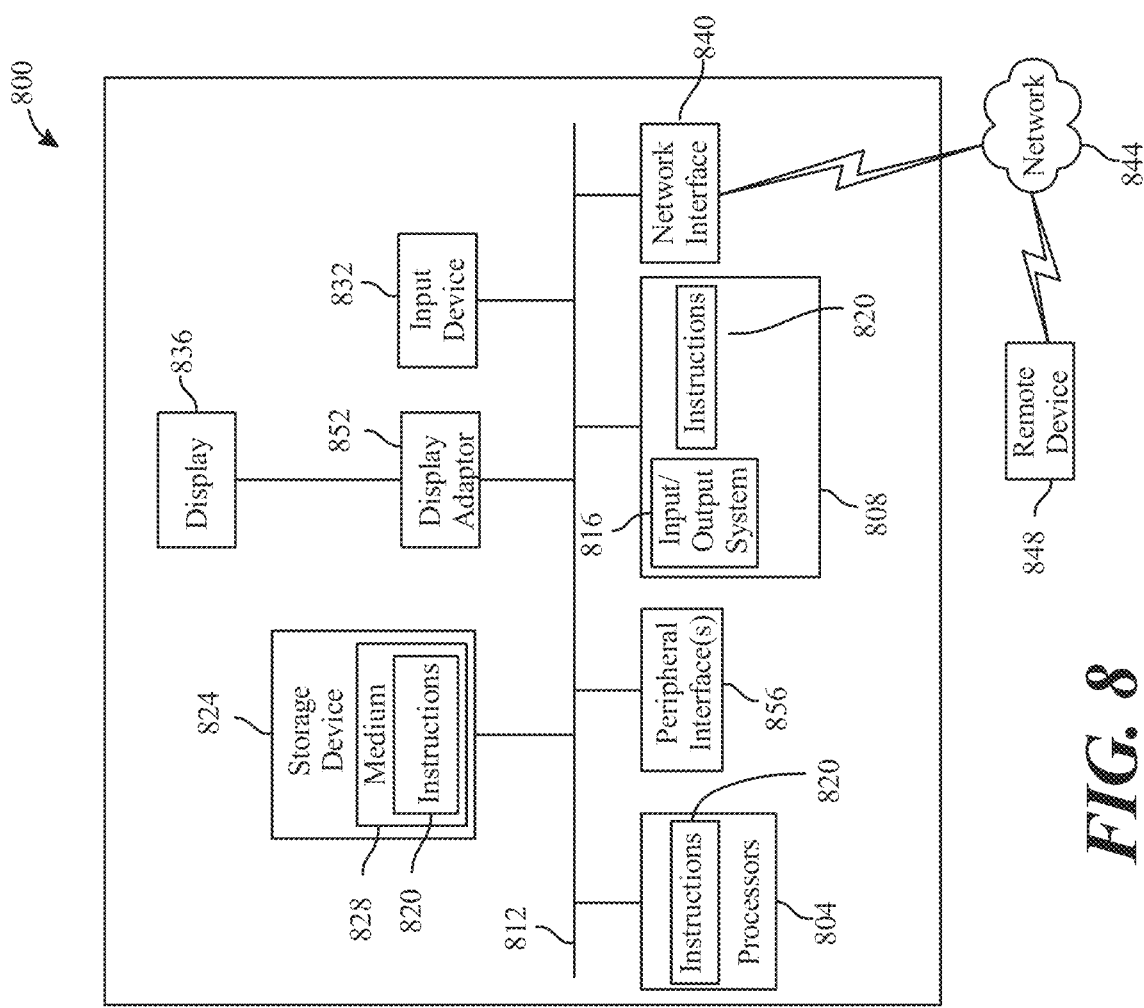
FIG. 8 is a block diagram of a computing system that can be used to implement any one or more of the methodologies disclosed herein and any one or more portions thereof.

FIG. 8 shows a diagrammatic representation of one embodiment of a computing device in the exemplary form of a computer system 800 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Processor 804 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 804 may be organized according to Von Neumann and/or Harvard architecture as a non-limiting example. Processor 804 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC).

Memory 808 may include various components (e.g., machine-readable media) including, but not limited to, a random-access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components hereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods and systems according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for determining architectural plan compliance using machine learning, the apparatus comprising:
   at least a processor; and
   a memory communicatively connected to the processor, the memory containing instructions configuring the at least a processor to:
      receive, by the processor, a design plan, wherein the design plan comprises structure parameters;

obtain, by the processor, construction constraints and geographical constraints as a function of the design plan;
identify, by the processor, a compliance threshold as a function of the construction constraints and the geographical constraints, utilizing a machine-learning model generated by a convolutional neural network which further comprises:
receiving compliance threshold training data, wherein the compliance threshold training data comprises construction constraint data and geographical constraint data correlated to compliance threshold data;
training, iteratively, the machine-learning model comprising an input layer of nodes, at least an intermediate layer of nodes and an output layer of nodes using the compliance threshold training data, wherein training the machine-learning model includes retraining the machine-learning model with feedback from previous iterations of the machine-learning model; and
identifying the compliance threshold using the trained machine-learning model;
determine a divergence element related to compliance of the design plan as a function of the compliance threshold and the design plan, wherein determining the divergence element comprises:
iteratively training, using construction constraint training data, a construction constraint machine learning model, wherein the construction constraint training data comprises compliance thresholds and design plans as inputs correlated to divergence elements as outputs; constraint machine learning model comprises:
determining the divergence element using the trained construction constraint machine learning model;
identify a degree of improvement as a function of the divergence element, wherein identifying the degree of improvement comprises determining a probability that the design plan falls within a buffer of the compliance threshold;
generate a design plan approval or rejection as a function of the degree of improvement.

2. The apparatus of claim 1, wherein the construction constraints comprise municipal building codes and municipal building code databases.

3. The apparatus of claim 2, wherein the building codes comprise structural, plumbing, and electrical requirements.

4. The apparatus of claim 1, wherein the compliance threshold comprises a threshold for structural requirements.

5. The apparatus of claim 1, wherein the construction constraint machine-learning model catalogs each variable for residential and commercial home plans using a checklist for quality assurance steps.

6. The apparatus of claim 1, wherein geofencing may be used to determine a location.

7. The apparatus of claim 1, wherein the construction constraint machine learning model is iteratively trained using previous outputs of the construction constraint machine learning model to provide a review of the construction constraints against submitted building plans and create an approval or deficiencies list for building plans.

8. The apparatus of claim 1, wherein the compliance threshold comprises a threshold for electrical requirements.

9. The apparatus of claim 1, wherein the processor provides a recommended corrective measure.

10. The apparatus of claim 1, wherein training the machine-learning model further comprises:
creating connections between nodes of the convolutional neural network by applying elements from the compliance threshold training data to the nodes of the input layer; and
adjusting the connections and weights between nodes in adjacent layers of the neural network using a training algorithm to produce desired values at the nodes of the output layer.

11. A method for determining architectural plan compliance using machine learning, the method comprising:
receiving, by a processor, a design plan, wherein the design plan comprises structure parameters;
obtaining, by the processor, construction constraints and geographical constraints;
identifying, by the processor, a compliance threshold as a function of the construction constraints and geographical constraints, utilizing a machine learning model generated by a convolutional neural network which further comprises:
receiving compliance threshold training data, wherein the compliance threshold training data comprises construction constraint data and geographical constraint data correlated to compliance threshold data;
training, iteratively, the machine-learning model comprising an input layer of nodes, at least an intermediate layer of nodes and an output layer of nodes using the compliance threshold training data, wherein training the machine-learning model includes retraining the machine-learning model with feedback from previous iterations of the machine-learning model; and
identifying the compliance threshold using the trained machine-learning model;
determining a divergence element related to compliance of the design plan as a function of the compliance threshold and the design plan, wherein determining the divergence element comprises:
iteratively training, using construction constraint training data, a construction constraint machine learning model;
determining the divergence element using the trained construction constraint machine learning model;
identifying, by the processor, a degree of improvement as a function of the divergence element, wherein identifying the degree of improvement comprises determining a probability that the design plan falls within a buffer of the compliance threshold;
generate a design plan approval or rejection as a function of the degree of improvement.

12. The method of claim 11, wherein construction constraints comprise municipal building codes and municipal building code databases.

13. The method of claim 12, wherein the building codes comprise structural, plumbing, and electrical requirements.

14. The method of claim 11, wherein the design plan includes residential structures.

15. The method of claim 11, wherein a compliance threshold comprises a threshold for structural requirements.

16. The method of claim 11, wherein the construction constraint machine-learning model catalogs each variable for residential and commercial structures using a checklist for quality assurance steps.

17. The method of claim 11, wherein geofencing may be used to determine a location.

18. The method of claim 11, wherein the construction constraint machine learning model is iteratively trained using previous outputs of the construction constraint machine learning model to provide a review of the construction constraints against submitted building plans and create an approval or deficiencies list for building plans.

19. The method of claim 11, wherein a compliance threshold comprises a threshold for electrical requirements.

20. The method of claim 11, wherein the processor may provide a recommended corrective measure.

\* \* \* \* \*